United States Patent
Tamaki et al.

(10) Patent No.: US 9,761,779 B2
(45) Date of Patent: *Sep. 12, 2017

(54) THERMOELECTRIC CONVERSION MATERIAL

(71) Applicant: Panasonic Corporation, Osaka (JP)

(72) Inventors: Hiromasa Tamaki, Osaka (JP); Tsutomu Kanno, Kyoto (JP); Akihiro Sakai, Nara (JP); Kohei Takahashi, Osaka (JP); Hideo Kusada, Osaka (JP); Yuka Yamada, Nara (JP)

(73) Assignee: PANASONIC CORPORATION, Osaka (JP)

(*) Notice: Subject to any disclaimer, the term of this patent is extended or adjusted under 35 U.S.C. 154(b) by 164 days.

This patent is subject to a terminal disclaimer.

(21) Appl. No.: 14/847,321

(22) Filed: Sep. 8, 2015

(65) Prior Publication Data
US 2015/0380623 A1 Dec. 31, 2015

Related U.S. Application Data

(63) Continuation of application No. PCT/JP2014/001882, filed on Mar. 31, 2014.

(30) Foreign Application Priority Data

Apr. 5, 2013 (JP) ................................. 2013-079795

(51) Int. Cl.
*H01L 35/00* (2006.01)
*H01L 35/18* (2006.01)
*C22C 12/00* (2006.01)
*C22C 30/00* (2006.01)

(Continued)

(52) U.S. Cl.
CPC ............... *H01L 35/18* (2013.01); *C22C 1/04* (2013.01); *C22C 1/0458* (2013.01); *C22C 12/00* (2013.01); *C22C 30/00* (2013.01); *H01L 35/34* (2013.01)

(58) Field of Classification Search
CPC ............................. H01L 35/18; C22C 30/00
See application file for complete search history.

(56) References Cited

U.S. PATENT DOCUMENTS

2007/0125416 A1* 6/2007 Iwanade ............ H01L 35/16
  136/236.1
2009/0038667 A1 2/2009 Hirono et al.

FOREIGN PATENT DOCUMENTS

| JP | 2005-286228 | 10/2005 |
| JP | 2007-158191 | 6/2007 |
| JP | 2009-74106 | 4/2009 |

(Continued)

OTHER PUBLICATIONS

International Search Report dated Jul. 1, 2014 in International (PCT) Application No. PCT/JP2014/001882.

(Continued)

*Primary Examiner* — Carol M Koslow
(74) *Attorney, Agent, or Firm* — Wenderoth, Lind & Ponack, L.L.P.

(57) ABSTRACT

A thermoelectric conversion material expressed by a chemical formula $X_3T_{3-y}T'_ySb_4$ ($0.025 \leq y \leq 0.5$), wherein the X includes one or more elements selected from Zr and Hf, the T includes one or more elements selected from Ni, Pd, and Pt, while including at least Ni, and the T' includes one or more elements selected from Co, Rh, and Ir.

5 Claims, 3 Drawing Sheets

(51) Int. Cl.
    *H01L 35/34*    (2006.01)
    *C22C 1/04*    (2006.01)

(56) References Cited

FOREIGN PATENT DOCUMENTS

| JP | 2009-81178 | 4/2009 |
|---|---|---|
| JP | 2009-81287 | 4/2009 |
| WO | 2007/063755 | 6/2007 |

OTHER PUBLICATIONS

International Search Report dated Jul. 1, 2014 in International (PCT) Application No. PCT/JP2014/001883.
International Search Report dated Jul. 1, 2014 in International (PCT) Application No. PCT/JP2014/001885.
J. R. Salvador et al., "Synthesis and Transport Properties of $M_3Ni_3Sb_4$ (M=Zr and Hf): An Intermetallic Semiconductor", Physical Review, vol. 77, pp. 235217-1-235217-8, 2008.
P. Larson, "Electronic Structure of the Ternary Zintl-Phase Compounds $Zr_3Ni_3Sb_4$, $Hf_3Ni_3Sb_4$, and $Zr_3Pt_3Sb_4$ and Their Similarity to Half-Heusler Compounds such as ZrNiSn", Physical Review, vol. 74, pp. 035111-1-035111-8, 2006.
International Preliminary Report on Patentability dated Oct. 6, 2015 in International (PCT) Application No. PCT/JP2014/001882.
International Preliminary Report on Patentability dated Oct. 13, 2015 in International (PCT) Application No. PCT/JP2014/001883.
International Preliminary Report on Patentability dated Jan. 28, 2016 in International Application No. PCT/JP2014/001885.

\* cited by examiner

THERMOELECTRIC CONVERSION MATERIAL

CROSS-REFERENCE TO RELATED APPLICATIONS

This is a continuation application of International Application No. PCT/JP2014/001882, with an international filing date of Mar. 31, 2014, which claims priority of Japanese Patent Application No. 2013-79795 filed on Apr. 5, 2013, the contents of which is incorporated herein by reference.

BACKGROUND OF THE INVENTION (1) Field of the Invention

This disclosure relates to a thermoelectric conversion material utilized for thermoelectric power generation and thermoelectric cooling.

(2) Description of Related Art

The thermoelectric power generation is a technology of converting thermal energy directly into electric energy by utilizing the Seebeck effect i.e., thermoelectromotive force generated between both ends of a substance by a temperature difference made between the both ends of the substance in proportion to the temperature difference. This technology is practically used as a power source for a remote place, a power source for space use, a power source for military use, etc. in some cases. The thermoelectric cooling is a technology using the Peltier effect, i.e., a phenomenon of transferring heat through electrons carried by an electric current. Specifically, the thermoelectric cooling is a technology of absorbing heat of a joint part by utilizing a fact that when an electric current is applied to two substances different in polarity of electric conduction carriers connected thermally in parallel and electrically in series, the difference in polarity of the electric conduction carriers (carriers) is reflected on a difference in direction of a heat flow. For example, the two substances different in polarity of electric conduction carriers used in this case are a p-type semiconductor having the electric conduction carriers (carrier) that are holes and an n-type semiconductor having the electric conduction carriers (carriers) that are electrons. Such an element configuration is of a so-called π type and is a most common configuration.

The energy conversion efficiency between heat and electricity in thermoelectric power generation and thermoelectric cooling is determined by a figure of merit ZT of material used. The figure of merit ZT is expressed by using a Seebeck coefficient S, an electric resistivity $\rho$, and a thermal conductivity $\kappa$ of the material and an absolute temperature T of evaluation environment as $ZT=S^2T/\rho\kappa$. The energy conversion efficiency becomes higher when the figure of merit ZT is higher, and the high figure of merit ZT is often achieved in a semiconductor into which electric conduction carriers are injected. Therefore, a semiconductor with a low thermal conductivity $\kappa$ is an important condition for achieving the high figure of merit ZT.

Additionally, a power factor $PF=S^2/\rho$ is often used as an index of material performance in thermoelectric power generation. The power factor PF is proportional to output power acquired in thermoelectric conversion and, therefore, large electric energy per unit time can be acquired by using a thermoelectric conversion material with a high power factor PF.

$X_3Ni_3Sb_4$ (X=Zr, Hf) is one of the semiconductors with a low thermal conductivity $\kappa$ and is proposed as a candidate for the thermoelectric material. The synthesis of this compound is already attempted and it is described that the thermal conductivity $\kappa$ at room temperature is 4.3 W/(m·K) in the case of X=Zr and is 2.7 W/(m·K) in the case of X=Hf (see, e.g., Nonpatent Literature 1).

Nonpatent Literature 1:

J. R. Salvador, X. Shi, J. Yang and H. Wang, "Synthesis and transport properties of $M_3Ni_3Sb_4$ (M=Zr and Hf): An intermetallic semiconductor", Physical Review B 77, 235217, Jun. 27, 2008

SUMMARY

However, the material described in Nonpatent Literature 1 provides only a very low performance index.

One non-limiting and exemplary embodiment provides a thermoelectric conversion material having a high performance index.

In one general aspect, the techniques disclosed here feature: a thermoelectric conversion material expressed by a chemical formula $X_3T_{3-y}T'_ySb_4$ ($0.025 \leq y \leq 0.5$), wherein the X comprises one or more elements selected from Zr and Hf, the T comprises one or more elements selected from Ni, Pd, and Pt, while including at least Ni, and the T' comprises one or more elements selected from Co, Rh, and Ir.

The thermoelectric conversion material according to this disclosure is expressed by a chemical formula $X_3T_{3-y}T'_ySb_4$ ($0.025 \leq y \leq 0.5$) and any of Co, Rh, and Ir can be substituted for a portion of Ni to achieve a high performance index and to maintain the thermoelectric conversion performance even when the material is exposed to the high temperature atmosphere.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

According to a first aspect, a thermoelectric conversion material expressed by a chemical formula $X_3T_{3-y}T'_ySb_4$ ($0.025 \leq y \leq 0.5$), wherein the X comprises one or more elements selected from Zr and Hf, the T comprises one or more elements selected from Ni, Pd, and Pt, while including at least Ni, and the T' comprises one or more elements selected from Co, Rh, and Ir.

Further, as a thermoelectric conversion material of a second aspect, in the first aspect, the X is Hf.

Further, as a thermoelectric conversion material of a third aspect, in the first aspect, the T' may be Co.

Further, as a thermoelectric conversion material of a fourth aspect, in the first aspect, the y may be within a range of $0.2 \leq y \leq 0.5$.

Further, as a thermoelectric conversion material of a fifth aspect, in the third aspect, the y may be within a range of $0.2 \leq y \leq 0.5$.

<Problem of Conventional Thermoelectric Conversion Material>

The present inventor studied conventional thermoelectric conversion materials, for example, a thermoelectric conversion material $X_3Ni_3Sb_4$ (X=Zr or Hf) including $Zr_3Ni_3Sb_4$ and $Hf_3Ni_3Sb_4$ described in Nonpatent Literature 1. As a result, the present inventor found a problem that although the high Seebeck coefficient S is exhibited, the conventional thermoelectric conversion material $X_3Ni_3Sb_4$ (X=Zr or Hf) is oxidized in the high temperature atmosphere, thereby significantly losing the thermoelectric conversion performance.

Therefore, this disclosure provides the thermoelectric conversion material $X_3Ni_3Sb_4$ having a high performance index as well as high-temperature durability.

The thermoelectric conversion material according to an embodiment of this disclosure will now be described with reference to the drawings.

(First Embodiment)

Figure 1:
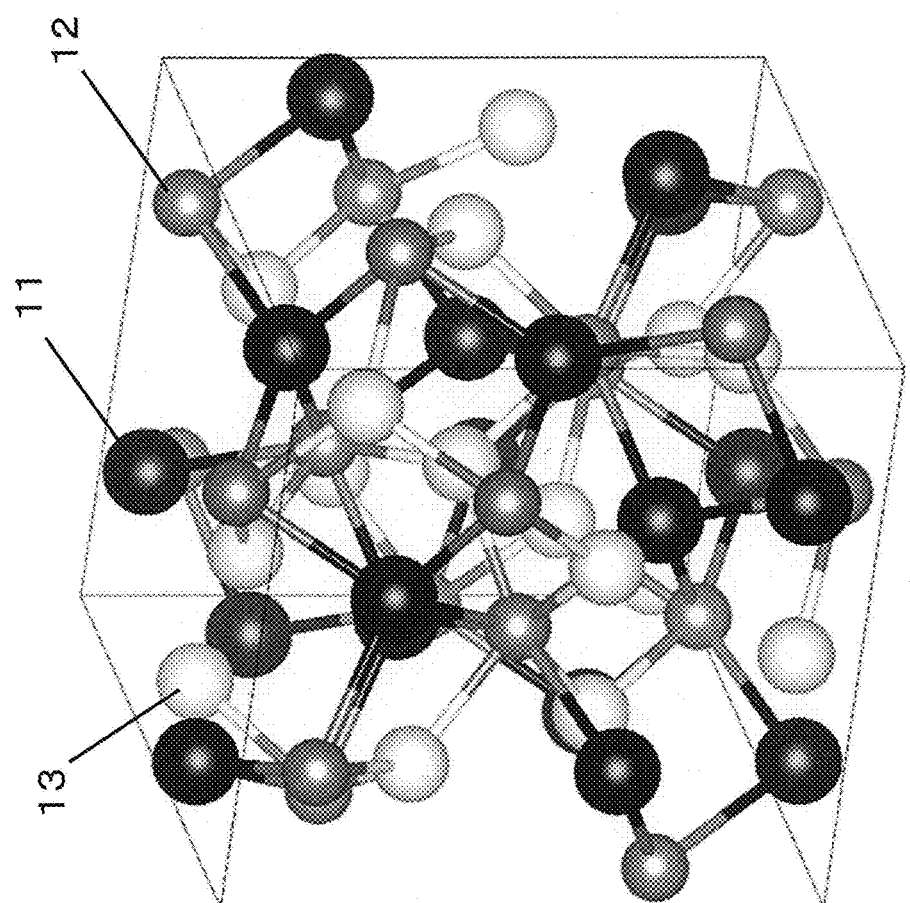
FIG. 1 is a schematic of a crystal structure of $X_3T_{3-y}T'_ySb_4$ that is a thermoelectric conversion material of this disclosure.

The thermoelectric conversion material $X_3T_{3-y}T'_ySb_4$ ($0.025 \leq y \leq 0.5$) according to a first embodiment of this disclosure will be described. X is composed of one or more elements selected from Zr and Hf; T is composed of one or more elements selected from Ni, Pd, and Pt, while including at least Ni; and T' is composed of one or more elements selected from Co, Rh, and Ir. The compound $X_3T_{3-y}T'_ySb_4$ has symmetry of a cubic crystal belonging to a space group I-43d. FIG. 1 is a schematic of a crystal structure of $X_3T_{3-y}T'_ySb_4$. As depicted in FIG. 1, $X_3T_{3-y}T'_ySb_4$ has the crystal structure in which atoms are arranged at a ratio of Zr+Hf:Ni+Pd+Pt+Co+Rh+Ir:Sb=3:3:4 in a unit cell.

Figure 2:
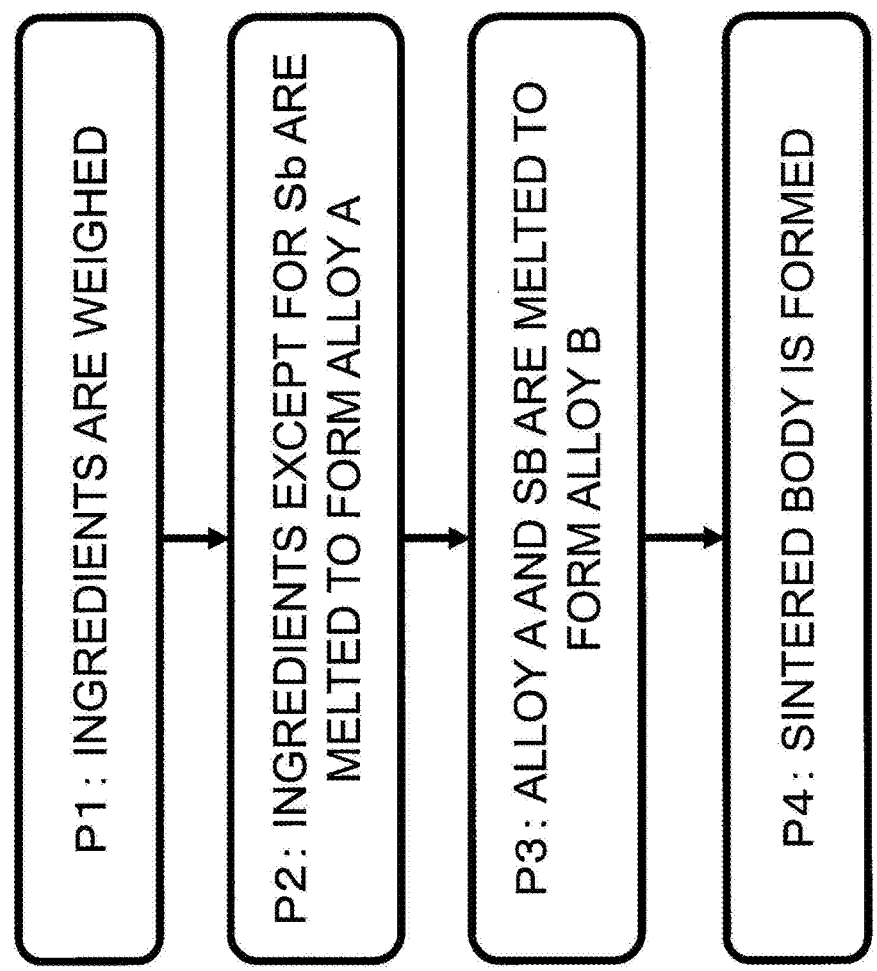
FIG. 2 is a schematic diagram of an example of a manufacturing procedure of $X_3T_{3-y}T'_ySb_4$ that is the thermoelectric conversion material of this disclosure.

A manufacturing method of this disclosure is not particularly limited. For example, the following manufacturing method as depicted in FIG. 2 is available.

(1) First, desired amounts of ingredients containing desired elements out of Zr, Hf, Ni, Co, Rh, Ir, Pd, Pt, and Sb are weighed at a stoichiometric ratio (process P1). A composition ratio estimated from the weighed ingredients is referred to as preparation composition.

(2) Among those, the ingredients containing desired elements out of Zr, Hf, Ni, Pd, Pt, Co, Rh, and Ir are alloyed by using an arc melting method to acquire an alloy A. In this process, the ingredients placed on a hearth liner are melted under an atmosphere replaced with an Ar gas at a high temperature of 2200° C. or higher by applying arc discharge plasma and are cooled to form the alloy A (process P2).

(3) The acquired alloy A and the ingredient containing Sb are melted at a low temperature of 1200 to 1500° C. under an Ar atmosphere by using the arc melting method and are cooled to form an alloy B (process P3).

The methods usable in the melting processes for producing the alloys A and B include not only the arc melting method but also a method using heating by a resistance heating element for melting under a vacuum state or an inert atmosphere, an induction heating method using high-frequency electromagnetic waves for melting, etc.

If the density of the alloy B is increased, a spark plasma sintering method (SPS method) is used for producing a sintered body (process P4). The SPS method is a sintering technique characterized by heating a sample by applying a pulsed current while applying pressure.

(a) First, the alloy B is ground and stirred by using a mortar/pestle or ball mill method to acquire powder of the alloy B. The grinding operation is desirably performed under an inert gas atmosphere so as to avoid oxidization of the powder. For this purpose, for example, a glove box may be used.

(b) The acquired powder of the alloy B is filled in a cylindrical graphite die having an outer diameter of 50 mm and an inner diameter of 10 mm and this die is introduced into a vacuum of 1 Pa or less.

(c) While a pressure of 50 MPa is applied from above and below the sample covered by the die, a pulsed current is applied through upper and lower punches to increase temperature to 850° C. at a rate of about 100° C./min. After increasing temperature to 850° C., the temperature is retained for 5 minutes, thereby acquiring a dense sintered body.

In the sintering process, a hot press method may be used instead of the SPS method.

The alloy B or the sintered body thereof can be processed into an arbitrary shape and utilized as a thermoelectric conversion material or used in measurement of physical properties of thermoelectric conversion.

(Example 1)

A sintered body of $X_3T_{3-y}T'_ySb_4$ was formed in accordance with an example of the manufacturing method described in the first embodiment. The sintered body was cut into a size suitable for a method of measurement described below to measure a thermal conductivity κ, an electric resistivity ρ, and a Seebeck coefficient S.

A method of measurement of the thermal conductivity κ will first be described. The thermal conductivity κ is obtained by using a density n, a specific heat C, and a thermal diffusivity I as $κ=n*C*I$. The density n was measured by using the Archimedes method. To acquire measurement values of the thermal diffusivity I and the specific heat C, the measurement device LFA457 manufactured by NETZSCH was used for measurement by the laser flash method.

For measurement of the thermal diffusivity by the laser flash method, the sintered body was cut out into a cylindrical shape of about 10 mm in diameter and 1 mm in thickness, and a sample with graphite coating applied to front and rear surfaces is introduced into an Ar atmosphere. The thermal diffusivity I was obtained from a temporal change in rear surface temperature when a laser was applied to the front surface of this sample. The laser flash method was also utilized for measurement of the specific heat of the sample by using a comparison method in which a temporal change in temperature of the sample rear surface after application of laser is compared with a sample having a known specific heat.

The Seebeck coefficient S and the electric resistivity ρ were measured by using the four-terminal method with the measurement device ZEM-3 manufactured by ULVAC-RIKO. The sample was cut out into a rectangular parallelepiped of about 2 mm*2 mm*8 mm and was measured under a helium atmosphere at 0.1 atm. An electric current was applied between both ends in the longitudinal direction and probe electrodes were brought into contact with two points interposed between the both ends in the longitudinal direction to detect a potential difference and a temperature difference between the probe electrodes. The electric resistivity ρ was obtained from an applied electric current I, a voltage difference ΔV between the probe electrodes, a sample cross-sectional area S, and a probe electrode interval L by using a definitional equation $ρ=ΔV/I*S/L$. The Seebeck coefficient S was obtained from a ratio between the voltage difference ΔV and a temperature difference ΔT by a definitional equation $S=-ΔV/ΔT$.

To verify the high-temperature durability for thermoelectric conversion material, the verification was performed based on how the thermoelectric conversion performance changed after one hour of heat treatment at 600° C. in the atmosphere. For a performance index to be verified, a power factor PF=S²/ρ was employed that is obtained from the electric resistivity ρ and the Seebeck coefficient S, which can be measured at the same time from the same sample. Specifically, the power factor is measured before and after the heat treatment in the atmosphere to calculate the reduction rate thereof.

Lastly, the actual composition of the sintered body acquired by the manufacturing process was analyzed by using the energy dispersive X-ray spectroscopy (EDX). The EDX method is a method of measuring a ratio of an element near a sample surface from energy distribution of characteristic X-rays generated when an electron beam is applied to a sample. Even in a conventional example, composition analysis is performed by using an electron probe microanalyzer (EPMA), which is an equivalent technique. In this measurement, the composition analysis was performed at four different points on a sample surface by the EDX method to obtain the composition from the average of the four points. In this description, the overall composition is represented by adjusting the abundance of Ni atoms to three in accordance with the Nonpatent Literature 1. In a system having substitution for an Ni atom, the overall composition ratio is represented such that the total number of atoms of Ni, Co, Cu, Rh, Pd, Ir, and Pt including a substituted element is set to three. The sum of the amounts of Sb, Ge, and Sn represented in this way less than four is defined as a state of insufficient Sb.

For the samples of the respective compositions, Table 1 describes the preparation compositions, the actual compositions, the values of the figure of merit ZT of the thermoelectric conversion at room temperature acquired from the measurement method described above, and the maximum values of the figure of merit ZT.

Conventional examples 1 to 4 described in Table 1 are calculated from the measurement values described in Nonpatent Literature 1 and only the values of the figure of merit at room temperature are reported. In the conventional examples 2 and 4, the actual composition slightly contains Hf although the preparation composition does not contain Hf. In the conventional example 3, the actual composition slightly contains Zr although the preparation composition does not contain Zr. It is considered this is because Zr or Hf used as ingredients in Nonpatent Literature 1 contained Hf or Zr as an impurity at about 1%.

Examples 1 to 6 and comparison examples 1 to 3 in Table 1 indicate the values at room temperature and the maximum values of the figure of merit ZT for the samples having Co substituted for Ni in $Zr_3Ni_3Sb_4$. The Co substitution provides the p-type electrical characteristics and results in a significant increase in the figure of merit ZT. Particularly, the maximum value of the figure of merit ZT is acquired at y=0.1, indicating high values of 0.205 at room temperature of 300 K and 0.519 at high temperature of 710 K.

Examples 7 to 9 in Table 1 indicate the figure of merit ZT when Hf is substituted for Zr in $Zr_3Ni_{2.9}Co_{0.1}Sb_4$ providing the optimum figure of merit ZT. It can be confirmed that the high figure of merit ZT exceeding 0.4 can be achieved by the Co substitution not only in $Zr_3Ni_3Sb_4$ and $Hf_3Ni_3Sb_4$ already reported but also in $Zr_{3-x}Hf_xNi_3Sb_4$, which is an alloy thereof.

Examples 12, 13 of Table 2 indicate the figure of merit ZT in the case of substitution by Rh and Ir instead of Co. The Rh substitution and the Ir substitution also provide the p-type electrical characteristics and result in a significant increase in the figure of merit ZT. Rh and Ir are the group 9 elements as is the case with Co and it is considered that the Rh substitution and the Ir substitution play a role in improvement in the figure of merit in the same way as the Co substitution.

TABLE 1

|  | Prepared Composition | Actual Composition | Performance Index ZT at Room Temperature | Maximal Performance Index $ZT_{max}$ (Temperature $T_{max}$ thereof) |
|---|---|---|---|---|
| Conventional Example 1 | $Zr_3Ni_3Sb_4$ | $Zr_{2.8}Ni_3Sb_{3.8}$ | 0.002 | — |
| Conventional Example 2 | $Zr_3Ni_3Sb_4$ + Sb added | $Zr_{2.88}Hf_{0.02}Ni_3Sb_{3.9}$ | 0.002 | — |
| Conventional Example 3 | $Hf_3Ni_3Sb_4$ | $Hf_{2.97}Zr_{0.1}Ni_3Sb_{3.72}$ | 0.016 | — |
| Conventional Example 4 | $Hf_3Ni_3Sb_4$ + Sb added | $Hf_{2.96}Zr_{0.09}Ni_3Sb_{4.07}$ | 0.002 | — |
| Example 1 | $Zr_3Ni_{2.975}Co_{0.025}Sb_4$ | $Zr_{3.05}Ni_{2.94}Co_{0.03}Sb_{3.88}$ | 0.113 | 0.257 (570 K) |
| Example 2 | $Zr_3Ni_{2.95}Co_{0.05}Sb_4$ | $Zr_{2.88}Ni_{2.98}Co_{0.06}Sb_{3.95}$ | 0.122 | 0.300 (570 K) |
| Example 3 | $Zr_3Ni_{2.9}Co_{0.1}Sb_4$ | $Zr_{2.78}Ni_{2.91}Co_{0.09}Sb_{3.78}$ | 0.205 | 0.519 (710 K) |
| Example 4 | $Zr_3Ni_{2.8}Co_{0.2}Sb_4$ | $Zr_{2.94}Ni_{2.77}Co_{0.16}Sb_{4.08}$ | 0.159 | 0.458 (770 K) |
| Example 5 | $Zr_3Ni_{2.7}Co_{0.3}Sb_4$ | $Zr_{3.16}Ni_{2.76}Co_{0.24}Sb_{4.12}$ | 0.103 | 0.307 (760 K) |
| Example 6 | $Zr_3Ni_{2.5}Co_{0.5}Sb_4$ | $Zr_{3.2}Ni_{2.52}Co_{0.48}Sb_{4.01}$ | 0.103 | 0.329 (850 K) |
| Comparative Example 1 | $Zr_3Ni_3Sb_4$ | $Zr_{3.07}Ni_3Sb_{4.14}$ | 0.013 | 0.044 (760 K) |
| Comparative Example 2 | $Zr_3Ni_{2.99}Co_{0.01}Sb_4$ | $Zr_{3.12}Ni_{2.98}Co_{0.01}Sb_{3.9}$ | 0.082 | 0.170 (520 K) |
| Comparative Example 3 | $Zr_3Ni_{2.3}Co_{0.7}Sb_4$ | $Zr_{2.78}Ni_{2.91}Co_{0.09}Sb_{3.78}$ | 0.084 | 0.275 (800 K) |
| Example 7 | $Zr_2HfNi_{2.9}Co_{0.1}Sb_4$ | $Zr_{1.98}Hf_{1.03}Ni_{2.96}Co_{0.12}Sb_{3.87}$ | 0.189 | 0.482 (710 K) |
| Example 8 | $ZrHf_2Ni_{2.9}Co_{0.1}Sb_4$ | $Zr_{1.04}Hf_{1.03}Ni_{2.89}Co_{0.08}Sb_{3.95}$ | 0.158 | 0.420 (710 K) |
| Example 9 | $Hf_3Ni_{2.9}Co_{0.1}Sb_4$ | $Hf_{3.1}Ni_{2.97}Co_{0.1}Sb_{4.01}$ | 0.180 | 0.504 (760 K) |
| Example 10 | $Zr_3Ni_{2.6}Pd_{0.3}Co_{0.1}Sb_4$ | $Zr_{2.86}Ni_{2.54}Pd_{0.36}Co_{0.1}Sb_{4.12}$ | 0.189 | 0.663 (710 K) |
| Example 11 | $Zr_3Ni_{2.6}Pt_{0.3}Co_{0.1}Sb_4$ | $Zr_{3.21}Ni_{2.55}Pt_{0.32}Co_{0.09}Sb_{3.86}$ | 0.207 | 0.606 (710 K) |
| Comparative Example 4 | $Zr_3Ni_{2.7}Pd_{0.3}Sb_4$ | $Zr_{3.09}Ni_{2.72}Pd_{0.28}Sb_{3.84}$ | 0.020 | 0.065 (470 K) |
| Comparative Example 5 | $Zr_3Ni_{2.7}Pt_{0.3}Sb_4$ | $Zr_{2.83}Ni_{2.74}Pt_{0.26}Sb_{3.99}$ | 0.030 | 0.116 (520 K) |

TABLE 2

| | Prepared Composition | Actual Composition | Performance Index ZT at Room Temperature | Maximal Performance Index $ZT_{max}$ (Temperature $T_{max}$ thereof) |
|---|---|---|---|---|
| Example 12 | $Zr_3Ni_{2.9}Rh_{0.1}Sb_4$ | $Zr_{3.06}Ni_{2.88}Rh_{0.12}Sb_{4.12}$ | 0.102 | 0.333(670K) |
| Example 13 | $Zr_3Ni_{2.5}Rh_{0.5}Sb_4$ | $Zr_{3.02}Ni_{2.51}Rh_{0.49}Sb_{3.95}$ | 0.075 | 0.203(710K) |
| Example 14 | $Zr_3Ni_{2.9}Ir_{0.1}Sb_4$ | $Zr_{3.05}Ni_{2.91}Ir_{0.09}Sb_{4.03}$ | 0.136 | 0.407(670K) |
| Example 15 | $Zr_3Ni_{2.5}Ir_{0.5}Sb_4$ | $Zr_{2.94}Ni_{2.46}Ir_{0.54}Sb_{3.91}$ | 0.086 | 0.258(760K) |

To evaluate the high-temperature durability, $Zr_{3-x}(Hf_x Ni_{3-y}Co_ySb_4$ was examined in terms of how the power factor PF at room temperature changes after one hour of heat treatment at 600° C. in the atmosphere. The heat treatment in the atmosphere blackened the surface of the sample and resulted in deterioration of the power factor associated with formation of $ZrO_2$ and Ni—Sb alloy.

Figure 3:
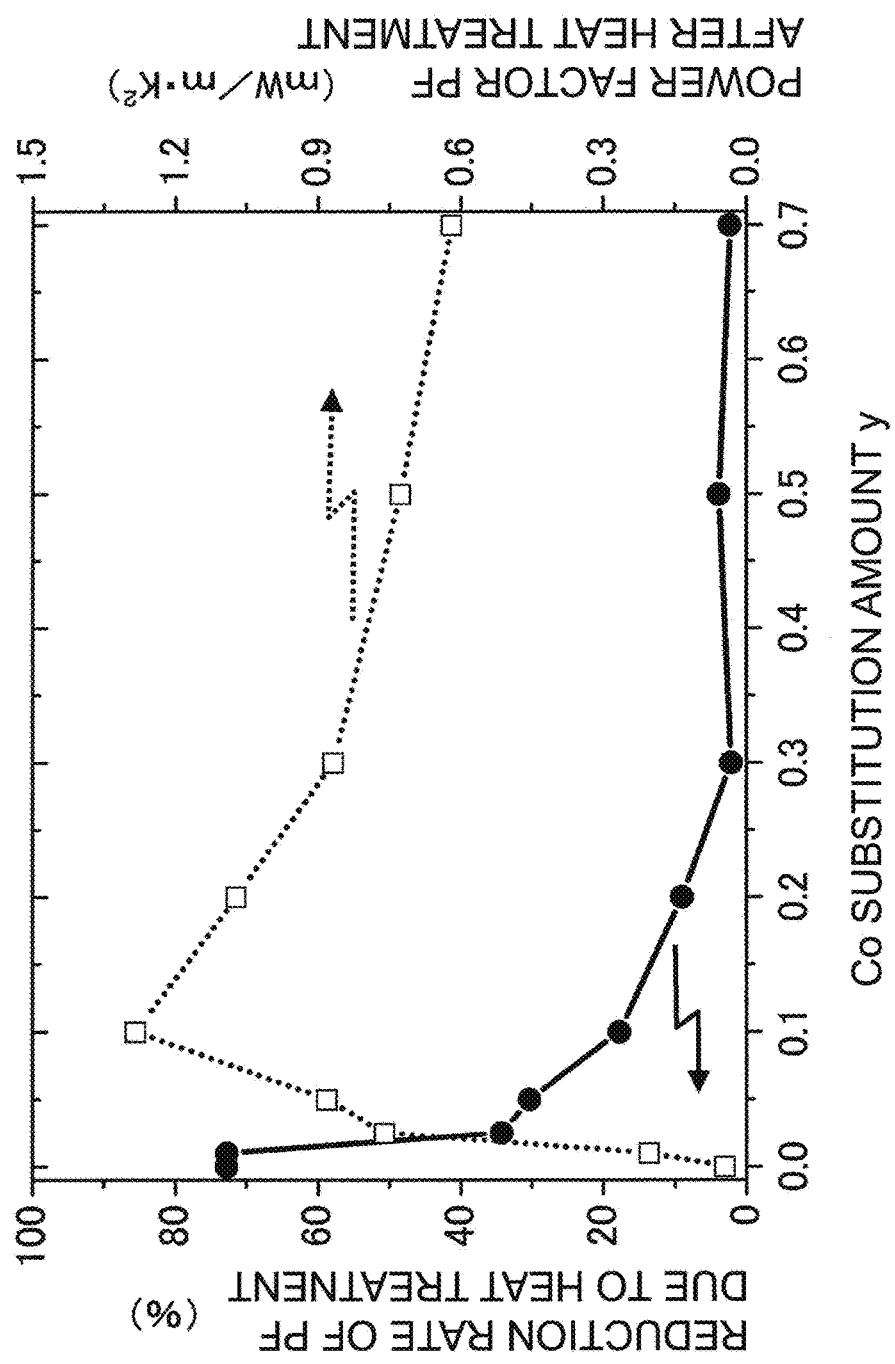
FIG. 3 is a graph of relationship of a value of a power factor, a reduction rate thereof, and a Co substitution amount y in $Zr_3Ni_{3-y}Co_ySb_4$ after heat treatment in the high temperature atmosphere.

Table 3 is a table describing the values of the power factor before and after the heat treatment in the atmosphere and the reduction rate thereof for $Zr_3Ni_{3-y}Co_ySb_4$. Table 2 describes a degree of reduction in the power factor at X=0 (when Hf is not contained) in $Zr_{3-x}Hf_xNi_{3-y}Co_ySb_4$ described above. FIG. 3 is a graph of relationship of the value of the power factor, the reduction rate thereof, and the Co substitution amount y in $Zr_3Ni_{3-y}Co_ySb_4$ after heat treatment in the high temperature atmosphere. Although the reduction rate was about 70% in the sample without Co (y=0), the reduction rate at y≥0.025 was reduced to half or less as compared to the case without Co. The reduction in the power factor due to the heat treatment in the atmosphere tends to be more suppressed when the Co amount is larger and, as depicted in FIG. 3, the reduction rate (●) of the power factor falls below 10% at y≥0.2. Therefore, it is found out that the Co substitution contributes to an increase in high-temperature durability of this material. Thus, the Co amount (y) is preferably 0.025 or more, more preferably 0.2 or more, from the viewpoint of the reduction rate of the power factor.

On the other hand, unlike the tendency of the high-temperature durability, as depicted in FIG. 3, the power factor (□) required for use as a thermoelectric conversion material starts decreasing at y=0.1. When the substitution by Co is performed to y=0.5, the power factor at room temperature after the heat treatment is about 56% as compared to the maximum value at y=0.1. When the substitution by Co is performed to achieve the condition of y=0.7, the power factor at room temperature after the heat treatment is half or less as compared to the maximum value at y=0.1. Therefore, the Co amount (y) is preferably 0.5 or less from the viewpoint of the power factor.

Therefore, if this material is used as the thermoelectric conversion material excellent in high-temperature durability, the range of the Co amount is preferably a range of 0.025≤y≤0.5, more preferably 0.2≤y≤0.5, in consideration of two viewpoints, i.e., the viewpoint of the reduction rate of the power factor and the viewpoint of the power factor.

TABLE 3

| y | Power Factor before the heat treatment (mW/(m · $K^2$)) | Power Factor after the heat treatment (mW/(m · $K^2$)) | reduction rate (%) |
|---|---|---|---|
| 0 | 0.164 | 0.044 | 72.8 |
| 0.01 | 0.747 | 0.204 | 72.8 |
| 0.025 | 1.157 | 0.760 | 34.3 |
| 0.05 | 1.264 | 0.881 | 30.3 |
| 0.1 | 1.560 | 1.283 | 17.7 |
| 0.2 | 1.178 | 1.072 | 9.0 |
| 0.3 | 0.886 | 0.867 | 2.1 |
| 0.5 | 0.755 | 0.726 | 3.8 |
| 0.7 | 0.634 | 0.619 | 2.3 |

Table 4 is a table describing the values of the power factor before and after the heat treatment and the reduction rate thereof in $Zr_{3-x}Hf_xNi_{2.9}Co_{0.1}Sb_4$. Specifically, the high-temperature durability of $Zr_{3-x}Hf_xNi_{2.9}Co_{0.1}Sb_4$ having Hf substituted for Zr is described for the material having the Co substitution amount y=0.1 giving the maximum values of the figure of merit ZT and the power factor PF. Referring to Table 3, since the reduction rate of the power factor is suppressed to 20% or less for any Hf amount of 0≤x≤3, it is found that the high-temperature durability is not limited by the proportion of Zr and Hf.

TABLE 4

| x | Power Factor before the heat treatment (mW/(m · $K^2$)) | Power Factor after the heat treatment (mW/(m · $K^2$)) | reduction rate (%) |
|---|---|---|---|
| 0 | 1.560 | 1.283 | 17.7 |
| 1 | 1.230 | 1.170 | 4.8 |
| 2 | 0.899 | 0.815 | 9.3 |
| 3 | 0.933 | 0.818 | 12.3 |

Table 5 describes the results of the materials acquired by substituting Pd and Pt for Ni in $Zr_3Ni_{3-y}Co_ySb_4$ when changes in the power factor before and after the heat treatment in the atmosphere are measured in the same way as Tables 2 and 3. Referring to Table 4, as is the case with the experimental result of Table 2, the high-temperature durability is improved by substituting Co for a portion of Ni.

TABLE 5

| Prepared composition | Actual Composition | Power Factor before the heat treatment (mW/(m · $K^2$)) | Power Factor after the heat treatment (mW/(m · $K^2$)) | reduction rate (%) |
|---|---|---|---|---|
| $Zr_3Ni_{2.6}Pd_{0.3}Co_{0.1}Sb_4$ | $Zr_{2.86}Ni_{2.54}Pd_{0.36}Co_{0.1}Sb_{4.12}$ | 1.414 | 1.257 | 11.1 |
| $Zr_3Ni_{2.6}Pt_{0.3}Co_{0.1}Sb_4$ | $Zr_{3.21}Ni_{2.55}Pt_{0.36}Co_{0.09}Sb_{3.86}$ | 1.340 | 1.373 | 16.3 |

TABLE 5-continued

| Prepared composition | Actual Composition | Power Factor before the heat treatment (mW/(m·K$^2$)) | Power Factor after the heat treatment (mW/(m·K$^2$)) | reduction rate (%) |
|---|---|---|---|---|
| $Zr_3Ni_{2.7}Pd_{0.3}Sb_4$ | $Zr_{3.29}Ni_{2.72}Pd_{0.28}Sb_{3.84}$ | 0.188 | 0.047 | 74.6 |
| $Zr_3Ni_{2.7}Pt_{0.3}Sb_4$ | $Zr_{2.83}Ni_{2.74}Pt_{0.26}Sb_{3.99}$ | 0.199 | 0.038 | 80.6 |

Table 6 describes the values of the power factor before and after the heat treatment in the atmosphere and the reduction rate thereof in $Zr_3Ni_{3-y}Rh_ySb_4$ or $Zr_3Ir_{3-y}Co_ySb_4$. Even when another group 9 element Rh or Ir is substituted instead of Co, the effect of increasing the high-temperature durability is provided as is the case with the Co substitution.

TABLE 6

| Prepared Composition | Actual Composition | Power Factor before the heat treatment (mW/(m·K$^2$)) | Power Factor after the heat treatment (mW/(m·K$^2$)) | reduction rate (%) |
|---|---|---|---|---|
| $Zr_3Ni_{2.9}Rh_{0.1}Sb_4$ | $Zr_{3.06}Ni_{2.88}Rh_{0.12}Sb_{4.12}$ | 1.141 | 1.005 | 11.9 |
| $Zr_3Ni_{2.5}Rh_{0.5}Sb_4$ | $Zr_{3.02}Ni_{2.51}Rh_{0.49}Sb_{3.95}$ | 0.677 | 0.662 | 2.2 |
| $Zr_3Ni_{2.9}Ir_{0.1}Sb_4$ | $Zr_{3.05}Ni_{2.91}Ir_{0.09}Sb_{4.03}$ | 1.477 | 1.204 | 18.5 |
| $Zr_3Ni_{2.5}Ir_{0.5}Sb_4$ | $Zr_{2.94}Ni_{2.46}Ir_{0.54}Sb_{3.91}$ | 0.718 | 0.698 | 2.8 |

As described above, according to the thermoelectric conversion material $X_3T_{3-y}T'_ySb_4$ (0.025≤y≤0.5; X is one or more elements selected from Zr and Hf; T is one or more elements selected from Ni, Pd, and Pt, while including at least Ni; T' is one or more elements selected from Co, Rh, and Ir) of this discloser, a predetermined range (0.025≤y≤0.5) of Co can be substituted for T including Ni to provide the predetermined power factor and improve the high-temperature durability.

The thermoelectric conversion material according to this disclosure can be used for configuring an element performing thermoelectric power generation or thermoelectric cooling.

EXPLANATIONS OF LETTERS OR NUMERALS 11 atom position (black) of Zr or Hf in a $Zr_{3-x}Hf_xT_{3-y}T'_ySb_4$ crystal 12 atom position (grey) of T=Ni, Pd, Pt, or T'=Co, Rh, Ir in the $Zr_{3-x}Hf_xT_{3-y}T'_ySb_4$ crystal atom position (white) of Sb in the $Zr_{3-x}Hf_xT_{3-y}T'_ySb_4$ crystal

The invention claimed is:

1. A thermoelectric conversion material expressed by a chemical formula $X_3T_{3-y}T'_ySb_4$ (0.025≤y≤0.5),
    wherein the X comprises one or more elements selected from Zr and Hf,
    the T comprises one or more elements selected from Ni, Pd, and Pt, while including at least Ni, and
    the T' comprises one or more elements selected from Co, Rh, and Ir.

2. The thermoelectric conversion material according to claim 1, wherein the X is Hf.

3. The thermoelectric conversion material according to claim 1, wherein the T' is Co.

4. The thermoelectric conversion material according to claim 1, wherein the y is within a range of 0.2≤y≤0.5.

5. The thermoelectric conversion material according to claim 3, wherein the y is within a range of 0.2≤y≤0.5.

* * * * *